(12) United States Patent
Kameyama et al.

(10) Patent No.: US 7,820,548 B2
(45) Date of Patent: Oct. 26, 2010

(54) SEMICONDUCTOR DEVICE AND MANUFACTURING METHOD THEREOF

(75) Inventors: Kojiro Kameyama, Ota (JP); Akira Suzuki, Ota (JP)

(73) Assignee: Sanyo Electric Co., Ltd., Osaka (JP)

( * ) Notice: Subject to any disclaimer, the term of this patent is extended or adjusted under 35 U.S.C. 154(b) by 784 days.

(21) Appl. No.: 11/822,122

(22) Filed: Jul. 2, 2007

(65) Prior Publication Data
US 2007/0254471 A1 Nov. 1, 2007

Related U.S. Application Data

(62) Division of application No. 11/236,847, filed on Sep. 28, 2005, now Pat. No. 7,256,420.

(30) Foreign Application Priority Data

Sep. 29, 2004 (JP) .............................. 2004-285030

(51) Int. Cl.
*H01L 21/44* (2006.01)
(52) U.S. Cl. ...................................... 438/648; 438/637
(58) Field of Classification Search ............. 438/648, 438/684, 637; 257/774
See application file for complete search history.

(56) References Cited

U.S. PATENT DOCUMENTS

| | | | |
|---|---|---|---|
| 5,618,752 A | 4/1997 | Gaul | |
| 6,225,227 B1 | 5/2001 | Aizawa | |
| 2003/0230805 A1 | 12/2003 | Noma et al. | |

FOREIGN PATENT DOCUMENTS

| | | |
|---|---|---|
| CN | 1204149 A | 1/1999 |
| CN | 1453865 A | 11/2003 |
| EP | 1376678 | 1/2004 |
| EP | 1416529 | 5/2004 |
| JP | 11-204525 | 7/1999 |
| JP | 2003-309221 | 10/2003 |
| KR | 2003-0058309 | 7/2003 |

OTHER PUBLICATIONS

European Search Report mailed Jun. 15, 2009, directed to corresponding European Application No. 05021359.4; (6 pages).

*Primary Examiner*—Roy K Potter
(74) *Attorney, Agent, or Firm*—Morrison & Foerster LLP

(57) ABSTRACT

A result of formation of an opening in a semiconductor substrate can be judged without cutting a semiconductor wafer and observing a cross-section of the cut wafer. A semiconductor device of this invention includes a semiconductor substrate, a pad electrode formed on the semiconductor substrate, an opening formed in the semiconductor substrate to expose the pad electrode, a wiring layer connected with the pad electrode through the opening and a monitoring opening formed in a scribe line to monitor a result of the formation of the opening.

9 Claims, 6 Drawing Sheets

US 7,820,548 B2

SEMICONDUCTOR DEVICE AND MANUFACTURING METHOD THEREOF

CROSS-REFERENCE OF THE INVENTION

This application is a divisional of U.S. patent application Ser. No. 11/236,847, filed Sep. 28, 2005, which is based on Japanese Patent Application No. 2004-285030, filed Sep. 29, 2004, the contents of which are incorporated herein by reference in their entireties.

BACKGROUND OF THE INVENTION

1. Field of the Invention

This invention relates to a semiconductor device having a metal layer formed on a semiconductor substrate, an opening penetrating through the semiconductor substrate to expose the metal layer and a wiring that is connected with the metal layer through the opening and its manufacturing method. Specifically this invention relates to a technology to monitor a result of the formation of the opening.

2. Description of the Related Art

A CSP (Chip Size Package) has received attention in recent years as a three-dimensional mounting technology as well as a new packaging technology. The CSP means a small package having about the same outside dimensions as those of a semiconductor die packaged in it.

A BGA (Ball Grid Array) type semiconductor device has been known as a kind of CSP. A plurality of ball-shaped conductive terminals made of metal such as solder is arrayed in a grid pattern on one principal surface of a package of the BGA type semiconductor device and is electrically connected with the semiconductor die mounted on the other side of the package.

When the BGA type semiconductor device is mounted on electronic equipment, the semiconductor die is electrically connected with an external circuit on a printed circuit board by compression bonding of the conductive terminals to wiring patterns on the printed circuit board.

Such a BGA type semiconductor device has advantages in providing a large number of conductive terminals and in reducing size over other CSP type semiconductor devices such as an SOP (Small Outline Package) and a QFP (Quad Flat Package), which have lead pins protruding from their sides. The BGA type semiconductor device is used as an image sensor chip for a digital camera incorporated into a mobile telephone, for example. An example of the BGA type semiconductor device includes a supporting member made of a glass, for example, attached to one of, or both of principal surfaces of the semiconductor die. Further description on the technologies mentioned above is provided in Japanese Patent Application Publication No. 2003-309221, for example.

Next, a manufacturing method of the BGA type semiconductor device, that includes the supporting member attached to one of the principal surfaces of the semiconductor die, will be described referring to the drawings.

FIGS. 8 through 10 are cross-sectional views showing the manufacturing method of the BGA type semiconductor device, that is applicable to an image sensor chip, according to a conventional art.

First, a pad electrode 32, that is a metal layer primarily composed of aluminum, is formed on a front surface of a semiconductor substrate 30 through an insulation layer 31 made of a silicon oxide film or a silicon nitride film, as shown in FIG. 8. Then a supporting member 34 made of glass, for example, is bonded to the semiconductor substrate 30 having the pad electrode 32 through an adhesive material 33 made of an epoxy resin layer.

Next, a photoresist layer 35 having an opening at a location corresponding to the pad electrode 32 is formed on a back surface of the semiconductor substrate 30. Plasma-etching is performed on the semiconductor substrate 30 with etching gas composed of $SF_6$ and $O_2$, for example, using the photoresist layer 35 as a mask, and further etching is performed on the insulation layer 31 to form an opening 36 extending from the back surface of the semiconductor substrate 30 to the pad electrode 32, as shown in FIG. 9.

An insulation layer 45 made of a silicon oxide film, for example, is formed on the back surface of the semiconductor substrate 30 including the inside of the opening 36. After the insulation layer 45 on the pad electrode 32 is removed, a barrier layer 37 is formed on the entire surface, as shown in FIG. 10. A seed layer 38 for plating is formed on the barrier layer 37 and a wiring layer 39 made of copper (Cu), for example, is formed on the seed layer 38 by plating. After a protection layer 40 is formed on the wiring layer 39, openings are formed in predetermined locations in the protection layer 40 and conductive terminals 41, that make contact with the wiring layer 39, are formed in the openings.

Then, the semiconductor substrate 30 and the layers stacked on it are cut into individual semiconductor dice, although not shown in the figure. A BGA type semiconductor device, in which the pad electrode 32 and the conductive terminal 41 are electrically connected, is formed as described above.

However, the shape of the opening 36 that is actually formed can not be recognized after the opening 36 is completed as described above, unless the semiconductor wafer is cut and a cross-section of the cut wafer is observed. That is, since the opening 36 is formed from the back surface of the opaque semiconductor substrate 30 so as to expose the pad electrode formed on the front surface of the semiconductor substrate 30 through the insulation layer 31, it is necessary to observe the opening 36 from a transparent supporting member 34 side of the semiconductor substrate 30, when the observation of the opening 36 is to be made through a microscope. When observed from the direction of the supporting member 34, however, the opening 36 is not visible because of the existence of the pad electrode 32 that is the metal layer. Therefore, it is not possible to determined just by looking at the completed devices if the semiconductor substrate 30 is completely removed in the opening 36 or it is not as indicated by dashed lines in FIG. 11. In addition, the opening size at the bottom end of the opening 36 may become too large because of the over-etching. Also, it is not possible to measure an aperture of the opening 36 visually.

SUMMARY OF THE INVENTION

The invention provides a semiconductor wafer ready for separation into individual dice. The wafer includes a semiconductor substrate having a first opening, a metal layer disposed on a first surface of the semiconductor substrate, a wiring layer disposed on a second surface of the semiconductor substrate and extending into the first opening to be electrically connected with the metal layer, and a monitoring portion that is a second opening formed in the semiconductor substrate and configured to provide clear view into the second opening.

The invention also provides a method of manufacturing a semiconductor device. The method includes providing a semiconductor substrate, forming a metal layer on a first surface of the semiconductor substrate, forming for a second surface of the semiconductor substrate a first opening in the semiconductor substrate to expose the metal layer, forming a second opening in the semiconductor substrate, forming a wiring layer on the second surface that is connected with the metal layer through the first opening, and viewing the second opening from a side of the first surface.

The invention further provides a semiconductor device that includes a semiconductor substrate having a first opening, a metal layer disposed on a first surface of the semiconductor substrate, a wiring layer disposed on a second surface of the semiconductor substrate and extending into the first opening to be electrically connected with the metal layer, and a monitoring portion that is a second opening formed in the semiconductor substrate and configured to provide clear view into the second opening.

DETAILED DESCRIPTION OF THE INVENTION

Next, a semiconductor device and its manufacturing method according to an embodiment of this invention will be explained, referring to FIGS. 1 through 7.

Figure 1:
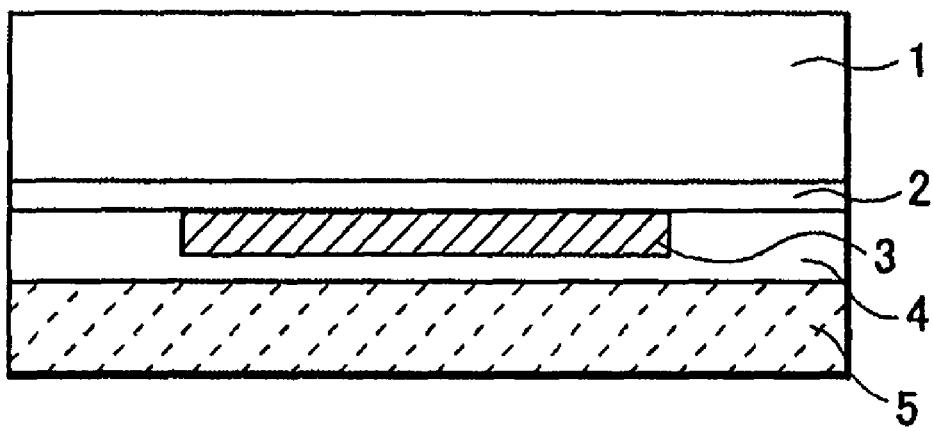
FIG. 1 is a cross-sectional view showing a manufacturing method of a semiconductor device according an embodiment of this invention.

First, a pad electrode 3 made of a metal layer primarily composed of aluminum is formed on a front surface of a semiconductor substrate 1 through an insulation layer 2 made of a silicon oxide film or a silicon nitride film, as shown in FIG. 1. Then a supporting member 5 made of a glass substrate, for example, is bonded to the front surface of the semiconductor substrate 1 having the pad electrode 3 through an adhesive material 4 made of an epoxy resin layer. The silicon wafer in this embodiment is divided into individual silicon dice to form CCD (Charge Coupled Device) image sensor chips, for example. Because the CCD in the front surface of the silicon die needs to receive external light, the supporting member 5 is required to be made of a transparent substrate such as the glass substrate or a semi-transparent substrate.

The supporting member 5 may be an opaque substrate when the silicon die does not receive or transmit light. However, the opaque substrate is not suitable in the case where the opening 36 is observed from the supporting member 34 side, as in the conventional art. Notwithstanding the above, the opaque substrate may be used when a monitoring opening 6b, that will be described later, is observed after forming the monitoring opening 6b and removing the supporting member 5. Furthermore, this monitoring opening 6b may also be formed in the semiconductor substrate 1 to which the supporting member 5 is not bonded.

Also, the supporting member 5 is not limited to the glass substrate and may be made of a plastic plate or a tape-shaped material.

The pad electrode 3 may be made of a metal other than aluminum, such as copper (Cu) or copper alloy.

Figure 2:
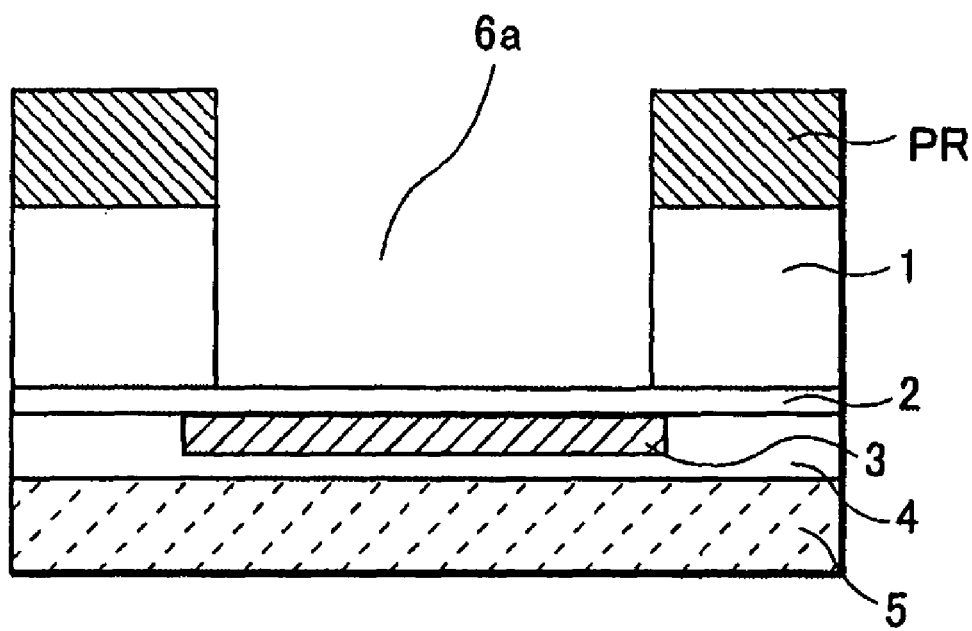
FIG. 2 is a cross-sectional view showing the manufacturing method of the semiconductor device according the embodiment of this invention.
Figure 3A:
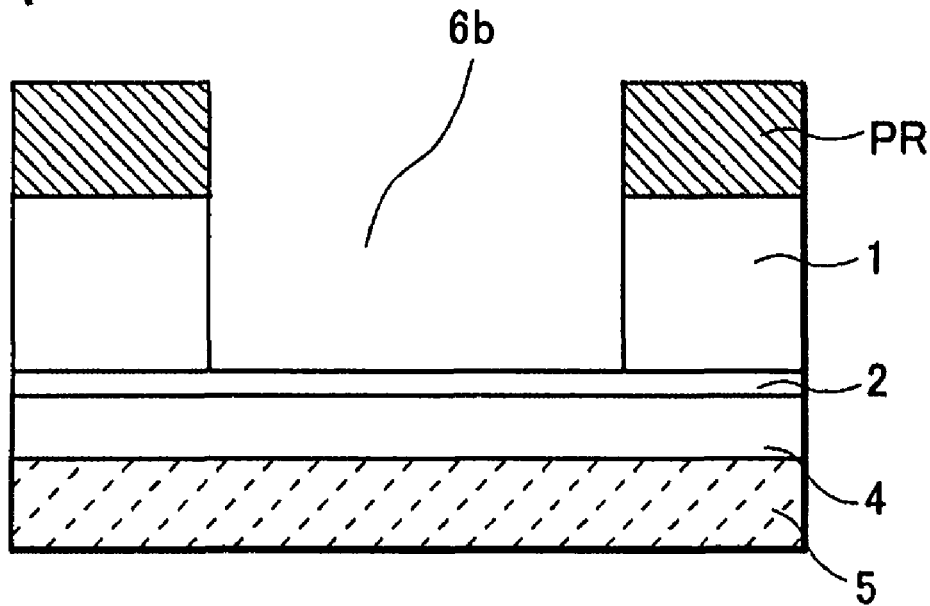
FIGS. 3A and 3B are cross-sectional views showing the manufacturing method of the semiconductor device according the embodiment of this invention.

Next, a photoresist layer PR that has an opening at a location corresponding to the pad electrode 3 is formed on a back surface of the semiconductor substrate 1. An opening 6a is formed in the semiconductor substrate 1 by plasma-etching the semiconductor substrate 1 using at least $SF_6$ and $O_2$ as etching gas and the photoresist layer PR as a mask, as shown in FIG. 2. At the same time, an opening 6b is also formed at a location of the semiconductor substrate 1 that corresponds to a scribe line, as shown in FIG. 3A. The opening 6b corresponds to the monitoring opening of this embodiment (hereafter referred to as the monitoring opening 6b). The formation of the monitoring opening 6b can be recognized by observing the monitoring opening 6b from a bottom side of FIG. 3A using an optical microscope. The recognized proper formation of the monitoring opening 6b assures the proper formation of the opening 6a which is formed under the same process conditions as the monitoring opening 6b and is not visually recognizable after the completion of the device.

In this case, visually inspecting the monitoring opening 6b through the microscope is made possible by not forming the metal layer, that makes the pad electrode 3, under the monitoring opening 6b.

Figure 3B:
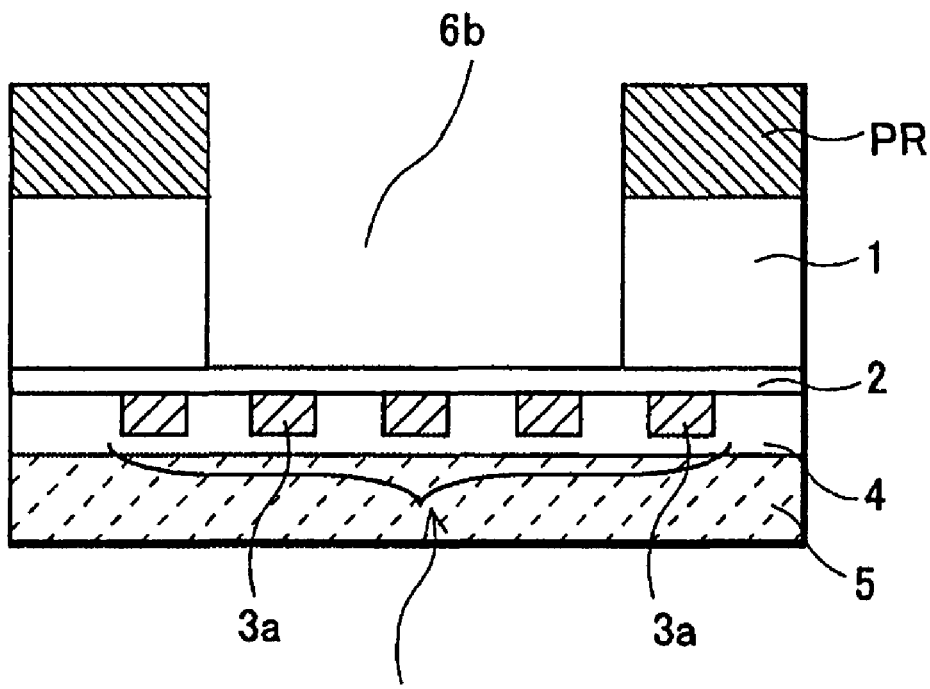
Figure 4:
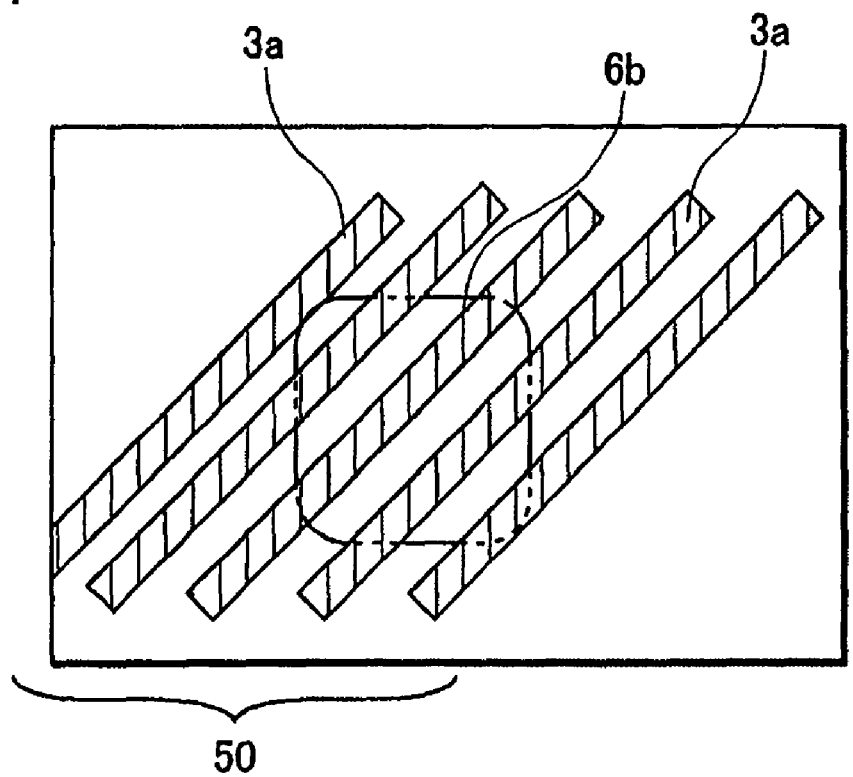
FIG. 4 is a plan view showing a monitoring pattern according the embodiment of this invention.

Or, a plurality of patterned metal layers 3a may be disposed at equal spaces under the monitoring opening 6b, as shown in FIG. 3B. Measuring an aperture of the monitoring opening 6b is made possible by forming a monitoring pattern 50 made of the plurality of patterned metal layers 3a so as to overlap the monitoring opening 6b. For example, in this embodiment the monitoring pattern 50 is made of rectangular-patterned metal layers 3a of a width of 5 μm arrayed with a constant spacing of 5 μm. Thus, when four patterned metal layers 3a and four of the spacing between the patterned metal layers 3a are observed in the monitoring opening 6b as shown in FIG. 4, the aperture of the monitoring opening 3b is 5×8=40 μm, approximately.

Thus, it can be determined whether the formation of the opening 6a is performed correctly or incorrectly, by observing the monitoring opening 6b. Namely, the visual observation reveals the incomplete removal of the semiconductor portion in the opening 6a or the over-etched opening 36 at its bottom end. In addition, with the use of the patterned metal layers 3a, it is made possible to measure the aperture of the opening 36 after the etching, without cutting the wafer and observing its cross-section as in the conventional art.

Although the monitoring opening 6b is formed in the scribe line in the embodiment, it may be formed in an unused space in the semiconductor die. In this case, the monitoring pattern 50 may be disposed at a matching location with the monitoring opening 6b.

Also, the monitoring pattern 50 is not limited to be rectangular. Each of various shapes of monitoring patterns 50 such as circular, cruciform and rhombic in shape may be formed in the scribe line or in the semiconductor die.

The aperture of the monitoring opening 6b is not necessarily equal to the aperture of the opening 6a. The result of formation of the opening 6a may be judged by observing the result of formation of the monitoring opening 6b having a different size of aperture from that of the opening 6a. Furthermore, the result of formation of the opening 6a may be judged by forming and observing a plurality of monitoring openings 6b having various sizes of apertures. Forming the plurality of monitoring openings 6b having various sizes of apertures enables judging results of formation of various patterns of openings 6a in accordance with actual patterning in the semiconductor device and improving workability of the observation.

Figure 5:
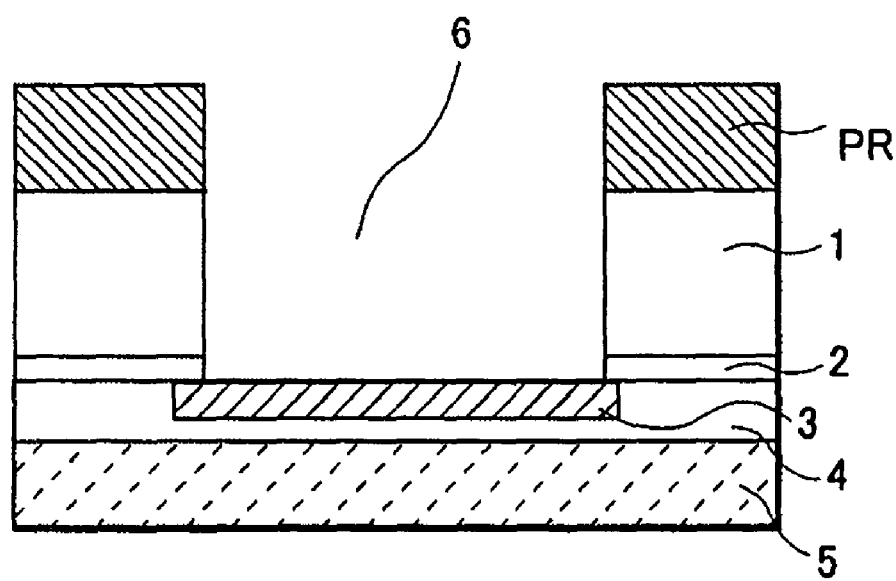
FIG. 5 is a cross-sectional view showing the manufacturing method of the semiconductor device according the embodiment of this invention.

Then an opening 6, that extends from the back surface of the semiconductor substrate 1 to the pad electrode 3, is formed by etching the insulation layer 2, as shown in FIG. 5.

Figure 6:
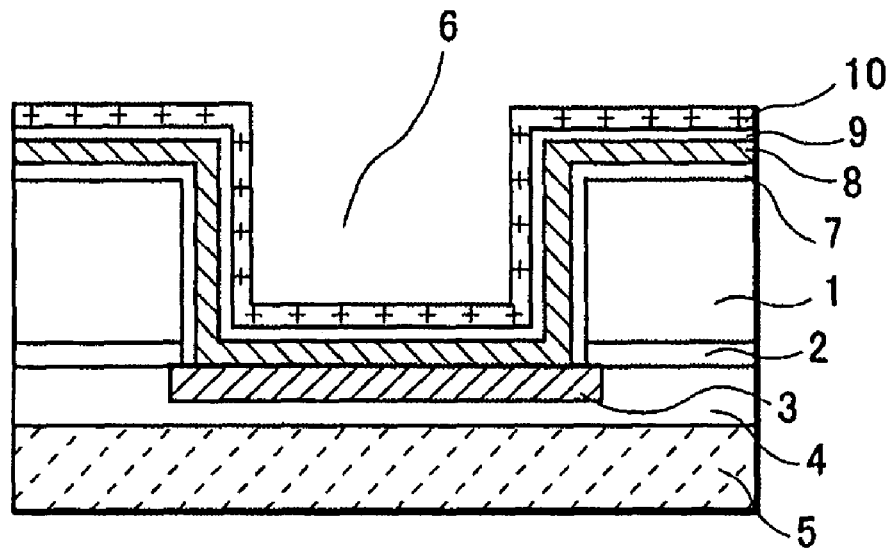
FIG. 6 is a cross-sectional view showing the manufacturing method of the semiconductor device according the embodiment of this invention.

Next, an insulation layer 7 made of a silicon oxide film, for example, is formed on the back surface of the semiconductor substrate 1 including the inside of the opening 6. After the insulation layer 7 on the pad electrode 3 is removed, a barrier layer 8 is formed on the entire surface, as shown in FIG. 6. The barrier layer 8 is preferably made of a titanium nitride (TiN) layer, for example. Or, the barrier layer 8 may be made of other refractory metal or its compound such as TiW, Ta or TaN, or stacked layers of such materials.

A seed layer 9 (a Cu layer, for example) for plating is formed on the barrier layer 8 and a wiring layer 10 made of copper (Cu), for example, is formed on the seed layer 9 by plating.

Figure 7:
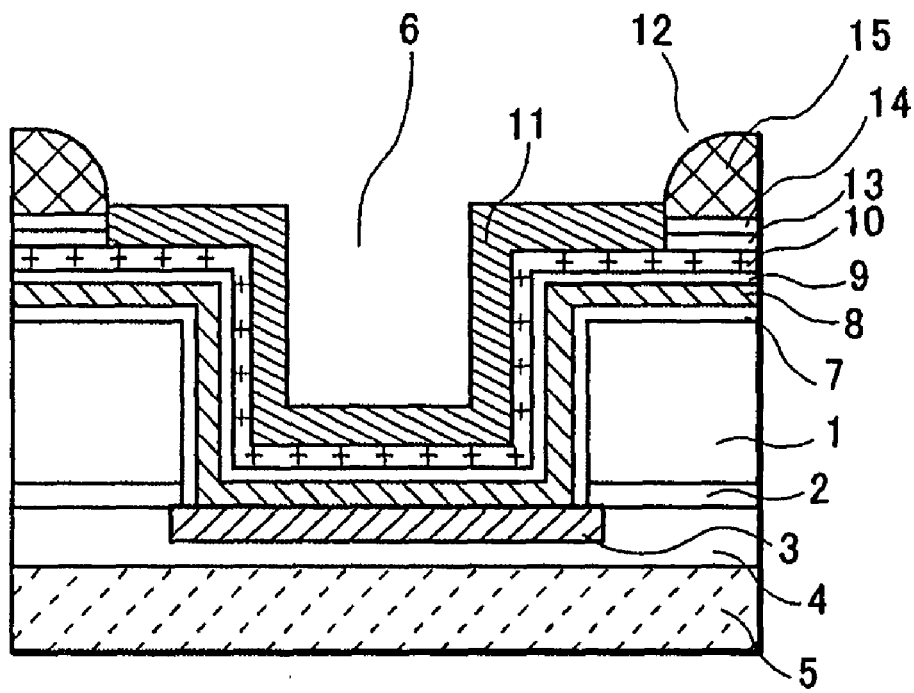
FIG. 7 is a cross-sectional view showing the manufacturing method of the semiconductor device according the embodiment of this invention.
Figure 8:
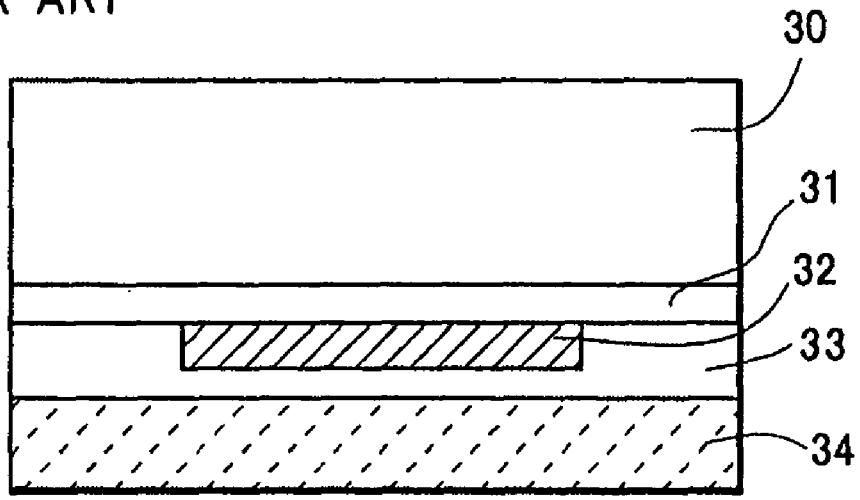
FIG. 8 is a cross-sectional view showing a manufacturing method of a semiconductor device according to a conventional art.
Figure 9:
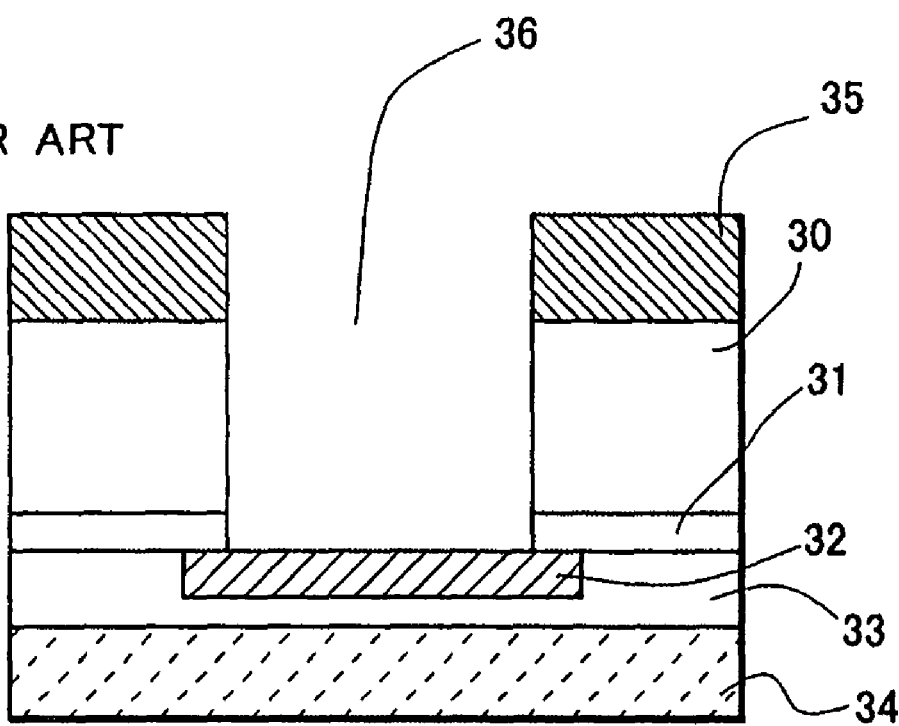
FIG. 9 is a cross-sectional view showing the manufacturing method of the semiconductor device according to the conventional art.
Figure 10:
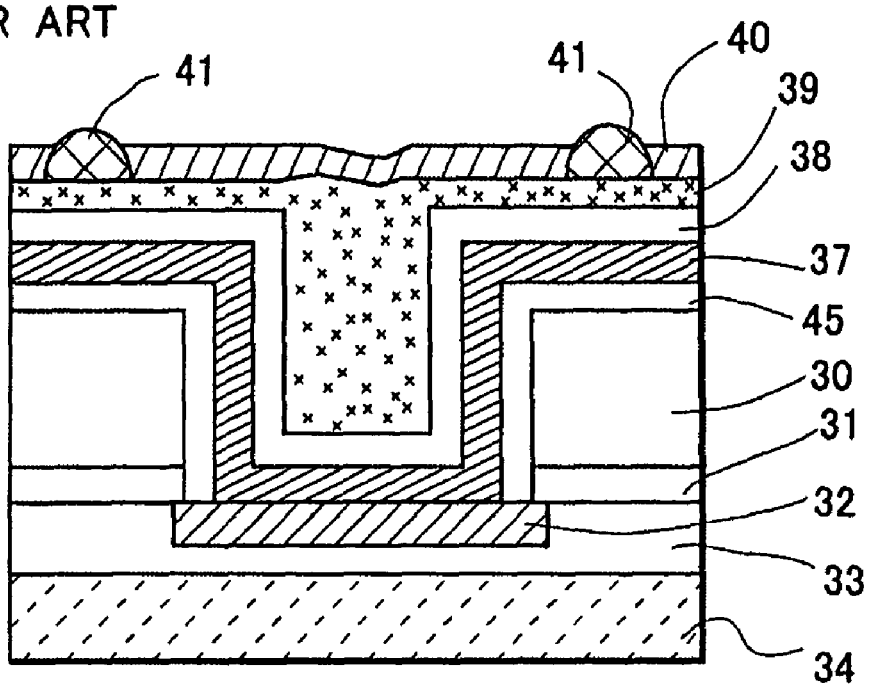
FIG. 10 is a cross-sectional view showing the manufacturing method of the semiconductor device according to the conventional art.
Figure 11:
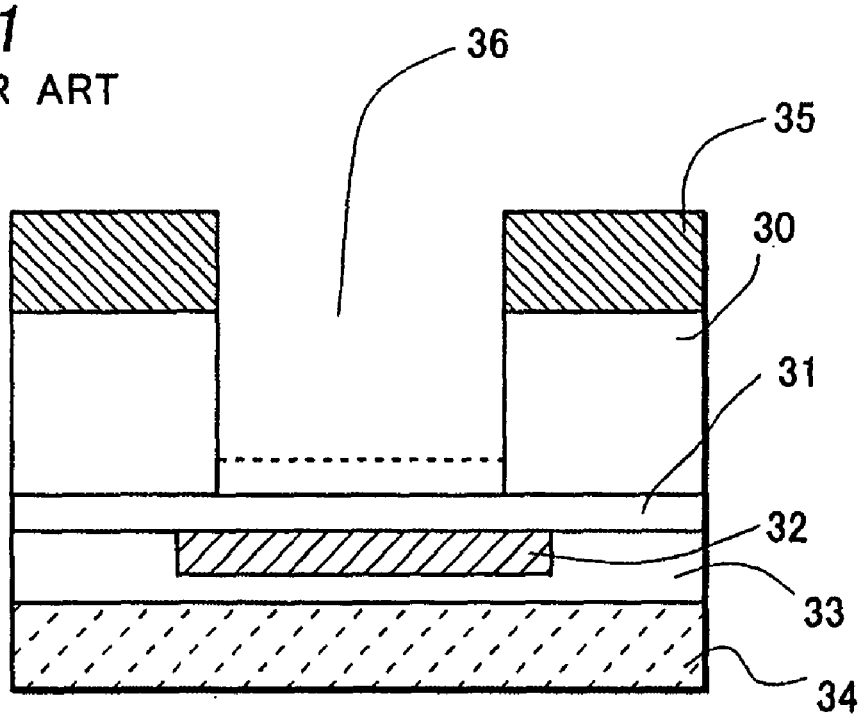
FIG. 11 is a cross-sectional view of a work in progress of the semiconductor device showing a problem with the conventional art.

A protection layer 11 is formed on the wiring layer 10, openings 12 are formed in the protection layer 11 at predetermined locations, a nickel (Ni) layer 13 and a gold (Au) layer 14 are formed on exposed portions of the wiring layer 10 and conductive terminals 15 connected with the wiring layer 10 through the Ni layer 13 and the Au layer 14 are formed by screen printing, as shown in FIG. 7. The protection layer 11 is not limited to the photoresist layer and the conductive terminals 15 are not limited to the conductive terminals 15 made of solder as described in the embodiment.

After that, the semiconductor substrate 1 and the layers stacked on it are cut into individual semiconductor dice, although not shown in the figure. A BGA type semiconductor device, in which the pad electrode 3 and the conductive terminal 15 are electrically connected, is formed as described above.

In this embodiment, the wiring layer 10 is made by plating as described. However, the wiring layer 10 may be made by a method other than the plating, without forming the seed layer 9, for example. It may be made by sputtering of aluminum or aluminum alloy, for example.

The device of this embodiment includes conductive terminals 15, as described. The structures of the embodiment is applicable to a semiconductor device not having the conductive terminals 15 such as an LGA (Land Grid Array) type semiconductor device, as long as the opening 6 penetrating through the semiconductor substrate 1 is formed.

The result of the formation of the opening can be judged by observing the result of the formation of the monitoring opening in this embodiment, without cutting the wafer and observing the cross-section of the cut wafer as in the conventional art.

The result of the formation of the monitoring opening can be easily observed by forming the monitoring opening in the scribe line and not disposing the metal layer under the monitoring opening.

The aperture of the opening can be easily judged by forming the rectangular patters under the monitoring opening that are made of the same layer as the metal layer.

What is claimed is:

1. A method of manufacturing a semiconductor device, comprising:
    providing a semiconductor substrate;
    forming a metal layer on a first surface of the semiconductor substrate;
    forming for a second surface of the semiconductor substrate a first opening in the semiconductor substrate to expose the metal layer;
    forming a second opening in the semiconductor substrate;
    forming a wiring layer on the second surface that is connected with the metal layer through the first opening; and
    viewing the second opening from a side of the first surface.

2. The method of claim 1, wherein the second opening is formed when the first opening is formed.

3. The method of claim 1, wherein the second opening is formed in a scribe line.

4. The method of claim 1, wherein the forming of the metal layer is performed so as not to cover the second opening.

5. The method of claim 1, wherein the forming of the metal layer comprises forming a monitoring pattern for size measurement over a location of the semiconductor substrate corresponding to the second opening.

6. The method of claim 5, wherein the forming of the monitoring pattern comprises forming of a rectangular pattern.

7. The method of claim 5, wherein the forming of the monitoring pattern comprises forming of a circular pattern, a cruciform pattern or a rhombic pattern.

8. The method of claim 1, further comprising forming a protection layer on the wiring layer, forming an opening in the protection layer and forming a conductive terminal on the wiring layer through the opening of the protection layer.

9. The method of claim 1, further comprising attaching a supporting member to the first surface side of the semiconductor substrate.

* * * * *